(12) United States Patent
Rombach

(10) Patent No.: US 8,664,733 B2
(45) Date of Patent: Mar. 4, 2014

(54) MEMS MICROPHONE AND METHOD FOR MANUFACTURE

(75) Inventor: Pirmin Hermann Otto Rombach, Kongens Lyngby (DK)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 13/579,433

(22) PCT Filed: Feb. 11, 2011

(86) PCT No.: PCT/EP2011/052019
§ 371 (c)(1),
(2), (4) Date: Sep. 7, 2012

(87) PCT Pub. No.: WO2011/101291
PCT Pub. Date: Aug. 25, 2011

(65) Prior Publication Data
US 2012/0326249 A1  Dec. 27, 2012

(30) Foreign Application Priority Data
Feb. 16, 2010 (DE) .......... 10 2010 008 044

(51) Int. Cl.
*H01L 29/84* (2006.01)

(52) U.S. Cl.
USPC .......... 257/416

(58) Field of Classification Search
CPC .......... B81B 2201/0257; B81B 2203/0127; B81C 1/00158

USPC .......... 257/415, 416
See application file for complete search history.

(56) References Cited

U.S. PATENT DOCUMENTS 6,535,460 B2 * 3/2003 Loeppert et al. .......... 367/181

OTHER PUBLICATIONS

Martin D.T. et al. "A Micromachined Dual-Backplate Capacitive Microphone for Aeroacoustic Measurements" Journal of Microelectromechanical Systems, vol. 16, No. 6, Dec. 6, 2007, pp. 1289-1302.*
International Search Report corresponding to co-pending International Patent Application Serial No. PCT/EP2011/052019, European Patent Office, dated Jun. 8, 2011; (2 pages).
Rombach, P. et al, "The first low voltage, low noise differential silicon microphone, technology development and measurement results" Sensors and Actuators A95, (2001), pp. 1-6.
Scheeper, P. et al. "A New Measurement Microphone Based on MEMS Technology" Journal of Microelectromechanical Systems, vol. 12, No. 6, Dec. 2003, pp. 880-891.
Scheeper, P. et al. "Improvement of the Performance of Microphones with a Silicon Nitride Diaphragm and Backplate" Sensors and Actuators A, 40 (1994) pp. 179-186.

* cited by examiner

*Primary Examiner* — Yu-Hsi D Sun
*Assistant Examiner* — Christina Sylvia
(74) *Attorney, Agent, or Firm* — Nixon Peabody LLP

(57) ABSTRACT

An improved method for manufacturing an MEMS microphone with a double fixed electrode is specified which results in a microphone which likewise has improved properties.

5 Claims, 11 Drawing Sheets

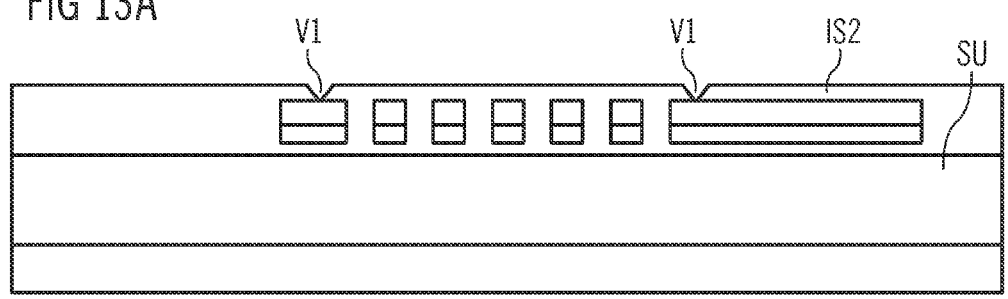
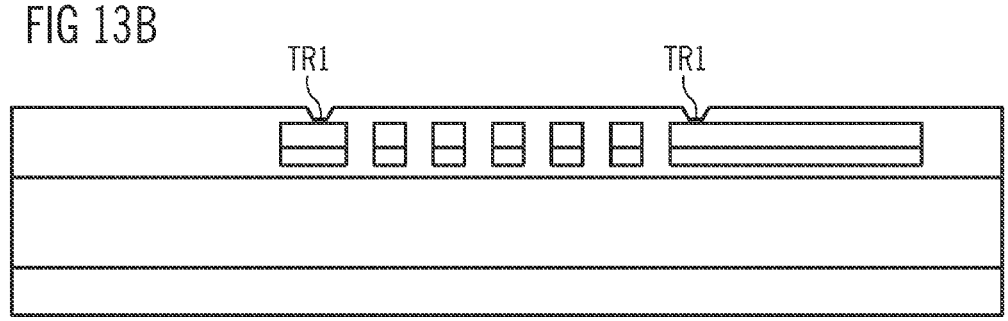
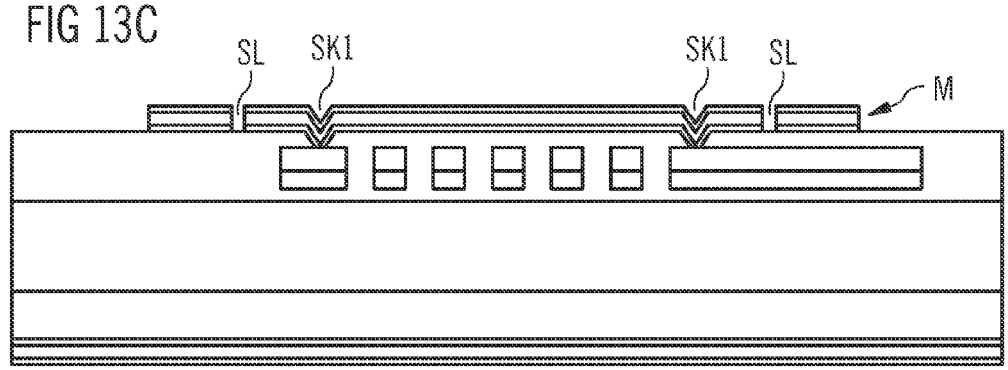

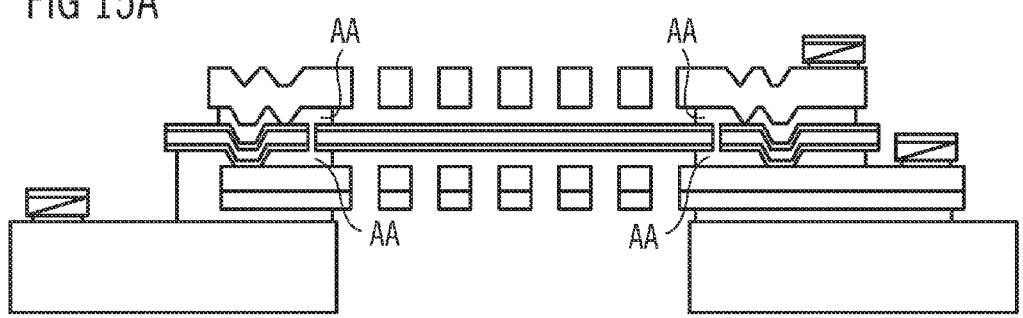
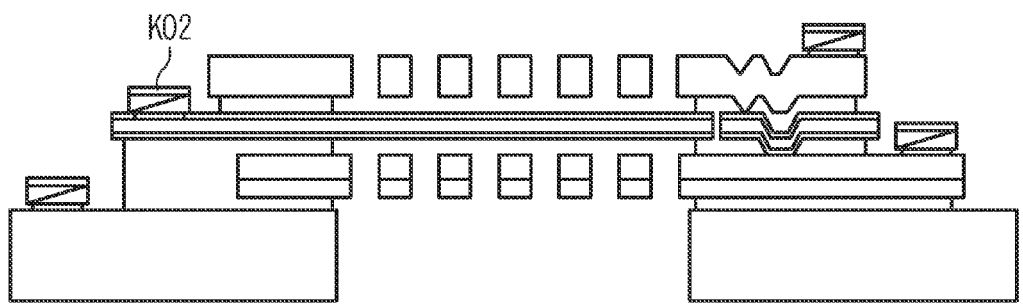

MEMS MICROPHONE AND METHOD FOR MANUFACTURE

CROSS-REFERENCE TO RELATED APPLICATIONS

This application is a U.S. National Stage of International Application No. PCT/EP2011/052019, filed Feb. 11, 2011, which claims the benefit of Germany Patent Application No. 102010008044.6, filed on Feb. 16, 2010, both of which are incorporated herein by reference in their entireties.

For communication applications use is increasingly being made of MEMS microphones (MEMS=micro electro mechanical system), which can be constructed on, in particular crystalline, substrates by means of micromechanical deposition and patterning processes. The microphones have a fixed electrode and a sound-deflectable membrane arranged at a distance therefrom, wherein the degree of deflection or the varying distance between fixed electrode and membrane can be read out electrically. Said MEMS microphones usually function according to the capacitance principle, in which the capacitance between fixed electrode and membrane is read out, said capacitance changing with the deflection of the membrane.

MEMS microphones can be manufactured simply and cost-effectively, but usually have the disadvantage of a low sensitivity. Furthermore, they can be sensitive relative to excessively high sound pressures.

An article by P. Rombach, M. Müllenborn, U. Klein and K. Rasmussen: "The first voltage, low noise differential silicon microphone, technology development and measurement results" in Sensors and Actuators A3124 (2001), pages 1 to 6, for the first time describes an MEMS microphone which is based on the capacitance principle and wherein the membrane is arranged symmetrically between two fixed electrodes. This microphone can now be operated differentially and can therefore yield in principle a double signal that can be used to establish a better signal-to-noise ratio and a higher sensitivity. What is disadvantageous about this microphone presented is the complicated and expensive manufacturing method proposed therein, which makes it more difficult to attain reliable reproducibility and thus mass production.

Therefore, it is an object of the present invention to specify an MEMS microphone which is improved with regard to its microphone properties and which can be manufactured simply and without impermissibly increased method expenditure with a double fixed electrode.

This object is achieved according to the invention by means of a microphone according to claim 1. Further claims relate to advantageous configurations of the invention and a method for manufacturing the microphone.

A microphone of MEMS design is specified, which is constructed on a substrate comprising at least silicon. Arranged on the substrate is a patterned layer construction having different functional layers required for the functions of the microphone: a bottom fixed electrode, thereabove a membrane and thereabove a top fixed electrode. Each of the functional layers can comprise one or a plurality of partial layers. At least one of the partial layers is respectively embodied in electrically conductive fashion.

The membrane is divided into different area regions that are accorded different functions. Thus, the membrane has an outer edge region completely enclosing a freely oscillating region. Within the freely oscillating region, the membrane has substantially planar surfaces. A significant proportion of the outer edge region is formed by an anchor region, in which the membrane is fixed against a vertical deflection between bottom and top fixed electrodes. In a manner omitted from the anchor region, a connection region remains in the outer edge region, an electrical lead to the membrane being arranged in said connection region. A perforation extending through the entire layer thickness is provided in the substrate, in which areally the entire freely oscillating region of the membrane is uncovered or accessible from below through the substrate. The anchor region of the membrane is preferably arranged outside the perforation above the substrate surface or above an inner edge region of the substrate.

This arrangement ensures that the membrane is vertically fixed between the two fixed electrodes, such that a symmetrical arrangement between the two fixed electrodes is stabilized and can always be reestablished after deflection of the membrane. Only in this way is it possible for deflections of the membrane from the rest position determined by the fixing to lead to a signal of identical magnitude at both fixed electrodes, or yields a change in the capacitance values that is identical in terms of absolute value. This makes possible a genuine differential read-out of the measured value at least for small deflections.

In this case, the measurement signal is composed of the capacitance changes in a first and a second capacitance that form between bottom fixed electrode and membrane and between membrane and top fixed electrode, respectively. During operation, each of the two capacitors is "biased" by a DC BIAS voltage, wherein the two BIAS voltages are applied such that the voltage changes resulting from the capacitance changes act oppositely to one another and thus add up positively in a differential amplifier.

The described fixing of the membrane in the anchor region prevents the membrane from being deflected from the symmetrical rest position on account of the not 100 percent symmetrical electrostatic forces, and the membrane from being deflected from the symmetrical rest position as a result of electrostatic forces acting on one side. This also guarantees that a maximum signal can already be read out during deflection by a sound pressure.

The microphone has an improved SNR ratio (signal-to-noise ratio), which can be improved by up to 3 dB. This makes it possible either to form the microphone with the same sensitivity on a smaller chip area or to provide it with higher sensitivity with the chip area remaining the same.

The differential read-out of the measurement signal furthermore allows elimination of disturbances, insofar as it acts symmetrically on both capacitances. Moreover, the sensitivity can be increased by a membrane embodied with a correspondingly large area to an extent such that the MEMS microphone according to the invention is even suitable for the high-end range.

In one embodiment of the invention, all partial layers of the layer construction are produced directly one above another as a layer composite assembly, wherein the membrane is fixed at least in the anchor region in the original layer composite assembly. Said layer composite assembly can comprise further layers that are not partial layers of the functional layers. The fixing of the membrane in the anchor region can therefore be effected between partial layers of the adjacent functional layers or between partial layers of the membrane and other layers different than said functional layers.

In one embodiment of the invention, the membrane has in the anchor region a first bulge, by which it is supported on the bottom fixed electrode. With said bulge, the membrane has, in a cross section considered transversely with respect to the layer plane, a height profile having the at least one bulge alongside the freely oscillating region embodied in substantially planar fashion. The bulge is fashioned such that it serves as a spacer of the membrane with respect to the bottom fixed electrode. However, it is also possible for a partial layer not counted among the functional layers also to be arranged in the layer composite assembly between the lower end of the bulge and the fixed electrode.

In the region of the bulge, the partial layers can be retained in the original layer composite assembly and therefore have the layer cohesion brought about by the construction of the layer composite assembly. However, it is also possible for the membrane with the bulge to be seated only loosely on the bottom fixed electrode.

In addition, the top fixed electrode can have in the anchor region of the membrane a second bulge, by which the top fixed electrode is supported on the membrane. Said second bulge also serves as a spacer, here between membrane and top fixed electrode. The second bulge can also be fixed in the original layer composite assembly, wherein the partial layers are fixedly connected to one another by direct deposition one on top of another. However, the second bulge can also bear only loosely on the bottom fixed electrode.

With the aid of first and second bulges, a secure vertical fixing of the membrane can be achieved in the anchor region. If the first and second bulges bear only loosely on the respectively adjacent functional layers, then although the membrane is vertically fixed, it is freely moveable laterally. This enables a lateral movement of the membrane which supports, in particular, the deflection of the membrane upon the action of sound pressure. In this way it is possible to alter the characteristic curve of the microphone in a desired manner.

An incision through the partial layers forming the membrane is arranged outside the edge region and in a manner adjoining the latter, said incision defining the size of the membrane and electrically isolating the active region from more outwardly situated area regions of the partial layers forming the membrane. Only in the connection region is a conductive connection provided within at least one partial layer of the membrane to a contact arranged outside the active region.

In accordance with one embodiment of the invention, outside the active region enclosed by the incision, insulation layers are arranged between bottom fixed electrode and membrane and between membrane and top fixed electrode. Said insulation layers can be formed, in particular, from silicon dioxide $SiO_2$.

Electrically conductive partial layers of the functional layers can be formed from polysilicon, which is then preferably conductively doped. The polysilicon layers can be provided with a p-type or n-type doping and can be highly doped with boron or phosphorus, for example. However, other dopants are also possible in the polysilicon layer, insofar as they can provide the latter with a suitable conductivity.

Further partial layers of the functional layers are, in particular, silicon nitride layers, which can serve both as electrical insulation layers and as mechanical stabilization layers. Thus, in one preferred embodiment, the bottom fixed electrode has a double layer composed of a silicon nitride layer and a polysilicon layer.

The membrane preferably has a symmetrical construction which supports a uniform deflection in both directions and increases the mechanical stability of the membrane. The symmetrical construction therefore consists, in particular, of three partial layers, wherein said highly doped polysilicon layer has a respective silicon nitride layer adjacent to it on both sides.

The top fixed electrode can also have one or a plurality of partial layers, but in the simplest embodiment consists of a conductive layer as single partial layer, in particular of a polysilicon layer.

Another aspect of the invention specifies an improved method for producing the MEMS microphone according to the invention. With respect to the known method described in the article by P. Rombach et al. cited in the introduction, this method is distinguished by the fact that all partial layers of the layer construction and of the layer composite assembly are applied sequentially one above another and are patterned from above, that is to say only from one side. Only the substrate is etched from below after the substrate construction has been manufactured, in order to produce the perforation below the freely oscillating region.

By contrast, sacrificial layers are etched simultaneously from above and below, said sacrificial layers being produced in the original layer composite assembly between the functional layers. The sacrificial layers are removed at least in the freely oscillating region of the membrane in the layer regions between the membrane and the two fixed electrodes, such that the free space produced as a result ensures the necessary distance between the functional layers.

The method comprises, in particular, the following steps:

a) One or a plurality of partial layers for a bottom fixed electrode are deposited one above another on a substrate.
b) The partial layers of the bottom fixed electrode are patterned by means of a lithographic etching method.
c) A second insulation layer is deposited conformally above the bottom fixed electrode, said second insulation layer thereupon being planarized e.g. in a polishing step. One or a plurality of partial layers for a membrane are likewise deposited.
d) The partial layers of the membrane are patterned by means of a lithographic etching method.
e) A third insulation layer and at least one or a plurality of partial layers for a top fixed electrode are deposited above the membrane.
f) The at least one partial layer of the top fixed electrode is patterned by means of a lithographic etching method.
g) A fourth insulation layer is produced above the top fixed electrode.
h) Contact holes to electrically conductive partial layers of bottom fixed electrode, membrane and top fixed electrode, and to the substrate are etched and contacts are subsequently produced therein.
i) A continuous perforation is etched through the substrate below an active region of the membrane.
j) The insulation layers serving as sacrificial layers are removed in the active region by means of isotropic wet etching.

The first insulation layer can be chosen such that it can serve as an etching stop layer for the etching of the perforation, which is led through from that surface of the silicon substrate which lies opposite the layer construction. The second and third insulation layers are preferably embodied as sacrificial layers that are removed by etching in the active region during method step j). The fourth insulation layer serves, in particular, as protection of the top fixed electrode during the manufacture of the contact holes, during the manufacture of the contacts in the contact holes, during the etching of the perforation of the silicon substrate and not least during the removal of the sacrificial layers formed by the second and third insulation layers. A preferred material for all insulation and sacrificial layers is silicon oxide, which can be applied in an LPCVD method (low pressure CVD method) (CVD=chemical vapor deposition). In principle, however, other insulation layers and sacrificial layers are also suitable, particularly if they can be etched selectively.

For the simplest embodiment of the MEMS microphone specified, all partial layers of the layer composite assembly are applied over the whole area on a respectively planar or planarized surface. Each of the functional layers is patterned after application, wherein the patterning can be carried out by the same method for all partial layers of a functional layer. In particular, reactive ion etching methods (RIE methods) having an anisotropic action can be used for this purpose, which can be set such that they have a selectivity relative to the insulation layers respectively arranged underneath. This makes it possible to carry out the patterning as far as the respectively underlying insulation layer smoothly and with a high aspect ratio.

During the patterning, top and bottom fixed electrodes are areally delimited and provided in the active region with a pattern of continuous holes which later make it possible to remove the sacrificial layers and form the channels for the passage of sound to the membrane during the operation of the microphone.

After all partial layers of a functional layer have been patterned, the next insulation layer is applied in edge-covering fashion, preferably once again in an LPCVD method, wherein $SiO_2$ produced from TEOS (TEOS=tetraethyl orthosilicate=Si $(OC_2H_5)_4$) is preferably used as insulation layer. The surface of the second insulation layer, which is uneven by virtue of the underlying patterned fixed electrode and the edge-covering application method, is leveled in a planarization method, for which purpose, in particular, a mechanical or a chemical mechanical method (for example CMP=chemical mechanical polishing) can be used. A desired layer thickness of the second insulation layer above the bottom fixed electrode can subsequently be set by deposition of a further partial layer.

In accordance with this exemplary embodiment, the membrane applied on a correspondingly level surface likewise has a planar surface, such that a third insulation layer deposited thereabove need not be planarized. The unevennesses, the unevennesses occurring as a result of the patterning edge after the patterning of the membrane, concern only such regions to which no function is assigned in the microphone, and so strict parallelism of the partial layers or parallelism of the corresponding surfaces is not necessary there either.

The partial layers of the functional layers are patterned such that the area regions remaining after the patterning become situated one above another with maximum mutual overlap. The areas of the functional layers that remain after the patterning decrease from the bottom toward the top, such that membrane and top fixed electrode are in each case arranged completely within the remaining area region of the underlying functional layer. In this way it is possible to provide contact holes to the respective functional layers at locations which are not covered by an overlying functional layer. The complete or maximum overlap also guarantees a maximum signal and a maximum mechanical stability for the layer construction or the layer composite assembly.

In accordance with this embodiment, all partial layers of all functional layers are arranged in planar fashion and thus parallel to one another. In the anchor region and in the layer regions of the functional layers that lie outside it, the original layer composite assembly is retained, that both in this outer region and in the anchor region the layer composite assembly strength achieved by the sequential deposition of the partial layers directly one above another retained, which stabilizes the entire construction there. In this embodiment, it is also possible in a simple manner to manufacture each of the functional layers exactly with a desired mechanical stress, which is of crucial importance for the optimum function and, in particular, for the deformation of the functional layers during the operation of the microphone.

The active region of the microphone is determined by the area which lie within said incision through the partial layers of the membrane and within which an overlap with the bottom fixed electrode, which is normally larger areally, and the top fixed electrode takes place. The size of the area of the active region determines, besides the distance, the capacitance value respectively formed by the membrane in relation to the two fixed electrodes.

After the patterning of the top fixed electrode, the contact holes to electrically conductive partial layers of each functional layer are produced. For this purpose, a lithography is carried out and the contact holes are etched to the desired depth. An RIE method can once again be used, which etches the insulation layers selectively with respect to the functional layers. In the case of the membrane, the topmost partial layer thereof, which is, in particular, a silicon nitride layer, can be removed by means of a subsequent separate etching step in the region of the bottom of the contact hole.

The contacts themselves are preferably constructed from three partial layers. Firstly, a base metallization is deposited over the whole area e.g. in a PVD process (PVD—Physical Vapor Deposition, e.g. sputtering or vapor deposition) and is subsequently removed again outside the contact holes, for example in a lithographic etching process.

A conductive layer composed of a metal that has good electrical conductivity and can be deposited well is produced above the base metallization by means of preferably electroless deposition from a liquid phase (chemical metal deposition). Thereabove, a covering layer serving for passivating the conductive layer and for producing a bondable and solderable surface is also applied selectively as covering layer.

Aluminum or some other metal that adheres well on polysilicon is suitable for the base metallization. Nickel is preferred for the conductive layer, while the covering layer comprises a noble metal such as e.g. gold or platinum.

The now completed layer construction can now be covered with a resist and a lithography for the definition of the perforation can be carried out on the underside of the substrate. Lithography resist and resist can comprise the same material.

The perforation can then be etched until the first insulation layer is uncovered, by means of an anisotropic etching method. A DRIE (=deep reactive ion etching) method is well suited, also known as the Bosch process, by means of which particularly high aspect ratios can be obtained during etching through the relatively fixed substrate. Steep to perpendicular sidewalls of the perforation have the advantage that the area requirement of the chip which is necessary for the construction of the microphone can thus be minimized. A smaller size makes the microphone more diversely useable and reduces costs. For the same chip size it is possible to realize, with steep sidewalls of the perforation, a larger active area and thus a more powerful microphone.

In the next method step, the sacrificial layers are removed in the freely oscillating region of the membrane. For this purpose, an isotropic etching method is used in order to completely remove the sacrificial layers including in shaded regions between the fixed electrodes and the membrane. By way of example, a VHF (vapor HF etch) method is well suited, which employs vaporous or gaseous hydrogen fluoride or hydrofluoric acid. This etching method works selectively with respect to silicon dioxide and silicon nitride, such that corresponding partial layers of the functional layers are not attacked or are only slightly attacked thereby.

The removal of the sacrificial layers is effected only freely oscillating region, such that the edge region, that is to say the anchor region and in the connection region the original layer composite assembly is maintained. The membrane is thus fixed all around in this layer composite assembly.

In this step, all protective layers and superfluous insulation layers are then removed from both surfaces of the substrate and of the layer construction.

In a last step, reactive surfaces can be passivated and saturated with unreactive groups. By way of example, the so-called SAM (=self assembling monolayer) method is suitable for this purpose. In this case, molecules comprising an elongated radical are bound by means of a reactive group at one end of the molecule to the reactive surfaces of the microphone and form there a monolayer, that is to say a monomolecular film having the thickness of a molecule length. The other end of the radical is chemically inert and preferably also has few physical interactions with other materials. If the radical is a fluorinated alkyl radical, for example, then the radicals are oriented with the inert ends parallel to one another and in a manner projecting perpendicularly from the surface. As a result, the surface is passivated, can no longer oxidize or corrode and is additionally water- and dust-repellant.

The microphone is now ready for use. For this purpose, it can be connected to a corresponding control and evaluation circuit via the contacts. Said circuit can be realized as a separate component or module. However, it is also possible to integrate at least parts of said circuit into the semiconductor body of the silicon substrate.

The invention is explained in greater detail below on the basis of exemplary embodiments and the associated figures.

The figures serve solely for elucidating the invention and are therefore illustrated only schematically and not in a manner true to scale. Individual parts may be illustrated in an enlarged manner or in a distorted manner in terms of the dimensions. Therefore, neither absolute nor relative dimensional specifications can be inferred from the figures. Identical or identically acting parts are provided with identical reference signs.

In the figures:

FIG. 1 shows a cross section through a substrate coated with a first partial layer construction, FIG. 2 shows a cross section through said construction with a patterned first functional layer thereon, FIG. 3 shows the arrangement after edge-covering deposition of an insulation layer, FIG. 4 shows the arrangement after planarization, FIG. 5 shows the arrangement after production of a second functional layer, FIGS. 6A and 6B show two different cross sections of the arrangement after the patterning of the second functional layer, FIG. 7 shows the arrangement after the production of the third functional layer, FIG. 8 shows the arrangement after the patterning of the third functional layer, FIG. 9 shows the arrangement after the production of a further insulation layer and the opening of contact holes therein, FIG. 10 shows the arrangement after the production of contact holes and contacts therein, FIG. 11 shows the arrangement after the production of a perforation through the silicon substrate, FIGS. 12A and 12B show different cross sections through the arrangement after the removal of the sacrificial layers in the freely oscillating region of the membrane, FIGS. 13A to 13F show different method stages during the manufacture of a microphone in accordance with a second exemplary embodiment, FIGS. 14A and 14B show two different cross sections through a finished microphone in accordance with the second exemplary embodiment, FIGS. 15A and 15B show two different cross sections through a microphone in accordance with a third exemplary embodiment, FIGS. 16A and 16B show two different cross sections through a microphone in accordance with a further method variant, FIGS. 17A and 17B show two different cross sections through a finished microphone in accordance with the first variant, FIG. 18 shows a plan view of a membrane together with insulation layers in the anchor region in accordance with the first exemplary embodiment, FIG. 19 shows the plan view of a membrane in accordance with the second exemplary embodiment.

FIG. 1 shows in schematic cross section a substrate SU with a first partial layer construction comprising a first insulation layer IS1 and two partial layers of the bottom fixed electrode FE1. Silicon, which has a suitable stability in the case of a thickness of approximately 400 µm, serves as substrate, by way of example. Thereabove, in a first LPCVD method, a first insulation layer IS1 is applied, for example a 1 µm thick $SiO_2$ layer deposited in a TEOS method.

The first functional layer is the bottom fixed electrode FE1, for which, as first partial layer FE11, one or a plurality of silicon nitride layers are applied with a layer thickness of 1 µm, for example, in an LPCVD method. The process is controlled such that the silicon nitride layer has a superstoichiometric content of silicon.

One or a plurality of polysilicon layers, likewise applied in an LPCVD method, serve as second partial layer FE12 of the bottom fixed electrode. During application, the polysilicon layer FE12 is highly doped in situ with an n- or a p-type dopant (e.g. boron or phosphorus), that is to say provided with a B++ or P++ doping. FIG. 1 shows the arrangement at this method stage. As can be seen, on account of the coating method chosen, the substrate SU is also concomitantly coated on the underside of the substrate SU as well as on the top side with the layer construction. On the one hand, it is not necessary to perform a coating on the underside, but it is equally unnecessary to prevent the underside coating since later etching steps follow during which these layers can be removed neither from the lower substrate surface. In some instances, the underside coating is even advantageous since, in this way, less stress is applied to the substrate SU during thermal processes in the course of layer deposition. Thus, an asymmetrical layer construction is avoided and a lower strain is produced.

FIG. 2 shows the arrangement after the patterning of the bottom fixed electrode FE1. For the sake of simplicity, the fixed electrode is illustrated only as a uniform functional layer, but still comprises the two partial layers FE11 and FE12 (see FIG. 1). For the purpose of patterning, a photoresist is applied and developed, and undesired layer regions of the bottom fixed electrode FE1 are removed. In particular, the bottom fixed electrode is areally delimited and provided with holes LO in the freely oscillating region, said holes firstly serving as sound openings and secondly enabling access for the etchant during later removal of the sacrificial layer.

The patterning of the bottom fixed electrode FE1 is accomplished by means of an RIE etching process, for example.

FIG. 3 shows the arrangement after the edge-covering application of a further insulation layer IS. This is done once again in a TEOS process in an LPCVD method. The layer thickness of said further insulation layer is dimensioned such that, firstly, the holes LO are completely overgrown with silicon oxide and, secondly, the total height of the insulation layer reaches at least the level of the top side of the bottom fixed electrode FE1. In the example chosen, for this purpose 2.2 μm are suitable for the further insulation layer.

The further insulation layer IS and first insulation layer IS1 combine on account of identical deposition conditions to form a homogenous layer, which is clarified in the figure by virtue of the fact that demarcation between first and further insulation layers is no longer illustrated.

FIG. 4 shows the arrangement after a planarization process, in which the insulation layer IS is ground away from the top down to the level of the upper partial layer FE12 of the bottom fixed electrode FE1. By way of example, a CMP method can be used for this purpose.

FIG. 5 shows the arrangement after the deposition of a second insulation layer IS2 and three partial layers for the membrane M. The second insulation layer IS2 is again applied as an $SiO_2$ layer with a layer thickness of 2 μm, for example, in a TEOS LPCVD method. For the membrane M, firstly a first partial layer TSM1 is applied as a silicon-rich silicon nitride layer with a layer thickness of 120 nm, for example, in an LPCVD method. Thereabove, as second partial layer TSM2, a polysilicon layer having a thickness of approximately 300 nm is applied, and in this case highly doped in situ with a dopant, which can once again be effected in an LPCVD method. The topmost and third partial layer TSM3 of the membrane M is once again a silicon nitride layer having a thickness of 120 nm, which is applied in a known manner. The cross-sectionally symmetrical construction of the membrane prevents the partial layers from being strained asymmetrically and the membrane from warping after being etched through on account of the strain.

FIG. 6A shows a first cross section through the arrangement after the patterning of the membrane. For this purpose, a lithography is carried out and the patterning is carried out in an RIE etching method designed for etching polysilicon and silicon nitride. If appropriate, the two layers can be etched under different conditions by continuously changing the etching atmosphere. During patterning, the membrane M is, in particular, areally delimited and the freely oscillating region is defined by production of incisions SL.

Figure 7:
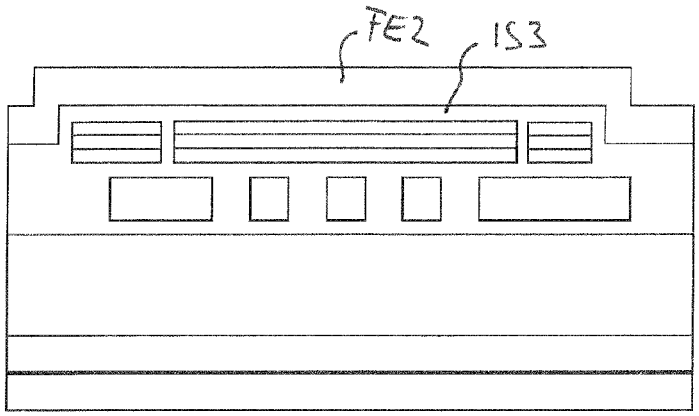

FIG. 7 shows the arrangement after the deposition of at least one further insulation layer IS and the top fixed electrode FE2. Planarization is not necessary here on account of the small structure width of the incision SL. For this purpose, firstly a third insulation layer in the form of a 2 μm thick $SiO_2$ layer is applied to the membrane M in a TEOS LPCVD method. For the top fixed electrode FE2, a polysilicon layer having a thickness of approximately 3 μm is applied to the 3rd insulation layer IS3 in an LPCVD method and in this case is highly doped in situ. Since all deposition processes are conducted with only little anisotropy and therefore in edge-covering fashion, partial layers applied one above another in each case follow the topography of the surface on which they are deposited.

Figure 8:
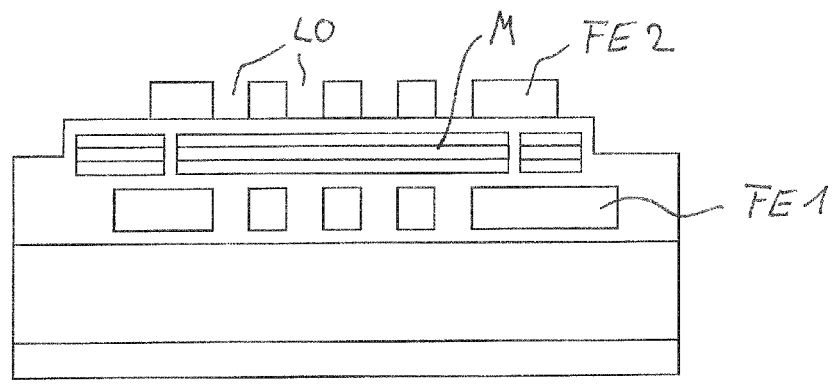

FIG. 8 shows the arrangement after the patterning of the top fixed electrode FE2, which can once again be carried out in a manner supported lithographically by means of an RIE etching method adjusted to the etching of polysilicon. In this case, the third insulation layer IS3 serves as an etching stop layer.

The top fixed electrode FE2 overlaps the active region and is patterned such that it is areally larger than that region of the membrane which is defined by the incisions SL. In the freely oscillating region, the top fixed electrode FE2 likewise provided with holes LO that fulfill the same purpose, already mentioned, as the holes in the bottom fixed electrode FE1.

In the next step, a further insulation layer IS is applied above the patterned top fixed electrode, for example a 300 nm thick $SiO_2$ layer applied in a TEOS LPCVD method. This layer completely covers the patterned top fixed electrode FE2 including in the holes and at the patterning edges.

Afterward, various contact holes KL are then etched through the insulation layers, at the bottom of which holes the conductive partial layers of top fixed electrode, membrane, bottom fixed electrode and silicon substrate are respectively uncovered. The contact holes are defined by means of a further lithographic step. The removal of the $SiO_2$ layers in the contact holes is carried out by means of a wet etching step adjusted selectively to $SiO_2$. In this case, the polysilicon layer of the top fixed electrode FE2, the topmost partial layer TSM3—comprising silicon nitride—of the membrane, the polysilicon layer FE12 of the bottom fixed electrode and the bulk silicon material of the substrate function as an etching stop layer. In order to uncover the polysilicon layer of the membrane, the silicon nitride layer also has to be removed in the corresponding contact hole, which is carried out by means of an RIE etching method.

Figure 9:
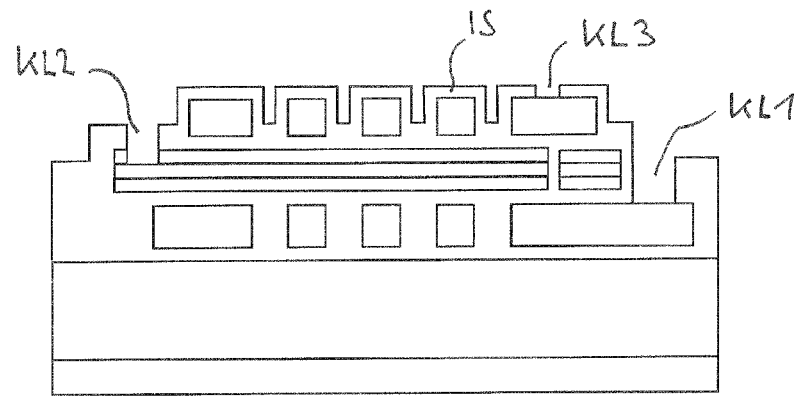
Figure 10:
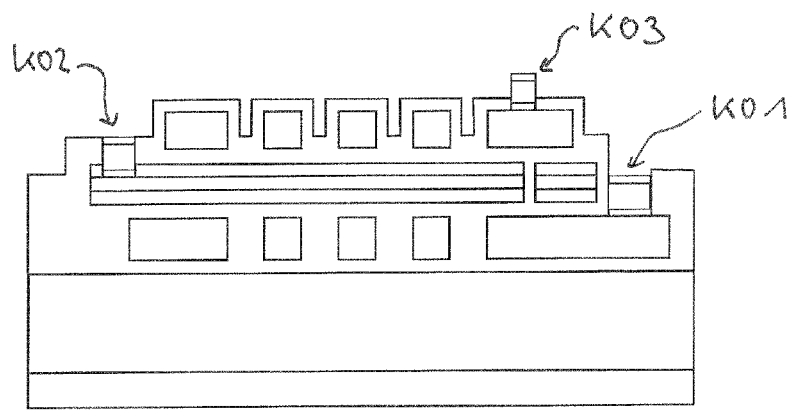

FIG. 9 shows a first contact hole KL1, in which the bottom fixed electrode FE1 is uncovered, a second contact hole KL2, in which the polysilicon layer of the membrane is uncovered, and a third contact hole KL3, in which the polysilicon layer of the top fixed electrode FE2 is uncovered. The illustration does not show possible further contact holes to one of the stated functional layers or to the substrate SU, e.g. comprising Si, into which semiconductor components or IC circuits can be integrated.

In the next step, contacts KO are produced in the contact holes. These are produced in the method already described, wherein a base metallization, a conductive layer and a covering layer are produced one above another. The base layer is deposited over the whole area and patterned. The conductive layer and the covering layer grow selectively above the patterned base metallization. Suitable layers are, for example, 1 μm aluminum for the base metallization, 3 μm nickel for the conductive layer and 300 nm Au for the covering layer.

Figure 11:
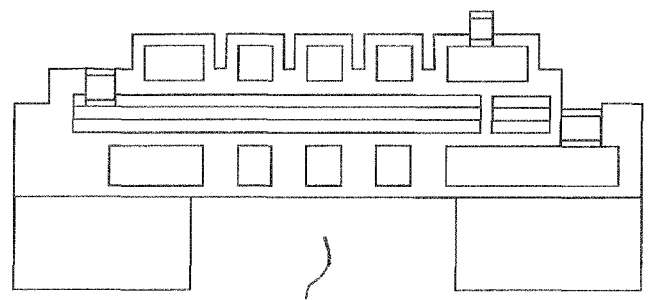

In the next step, a perforation DB through the substrate SU is defined lithographically and etched anisotropically by means of a DRIE method. In addition area region provided for the perforation DB on the underside of the substrate SU, all other surfaces are covered with a protective layer, in particular with the resist used for the lithography. In the DRIE method, the first insulation layer directly on the substrate serves as an etching stop layer. FIG. 11 shows the arrangement after the finished perforation DB has been manufactured.

The next step then involves removing those regions of the insulation layers IS which serve as sacrificial layers, in particular in the freely oscillating region between bottom fixed electrode FE1, membrane and top fixed electrode FE2, and also the remaining insulation layers applied superficially. The VHF method already described is used for this purpose.

Figure 12A:
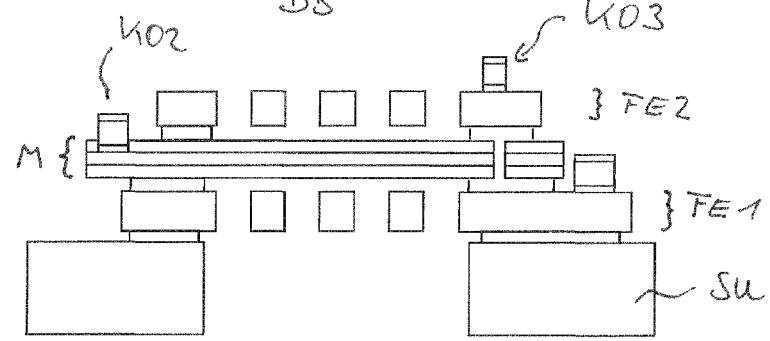
Figure 12B:
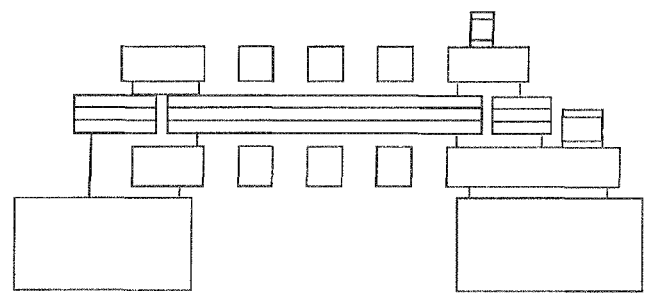

FIG. 12A shows a first cross section through the structure obtained in this way, in which the microphone has largely been completed. While the cross section from FIG. 12A is taken through the connection region of the membrane M and the associated contact KO2, the cross section from FIG. 12B shows a membrane region which is electrically isolated on both sides by the incisions SL from outer remaining area regions of the partial layers forming the membrane. It is evident that the insulation layers are slightly undercut by the isotropic VHF etching method. Nevertheless, in the anchor region corresponding to the outer edge region of the membrane defined by the incisions SL, the original layer composite assembly is maintained, which fixes the outer edge region, in particular the anchor region, in said original layer composite assembly.

Figure 17A:
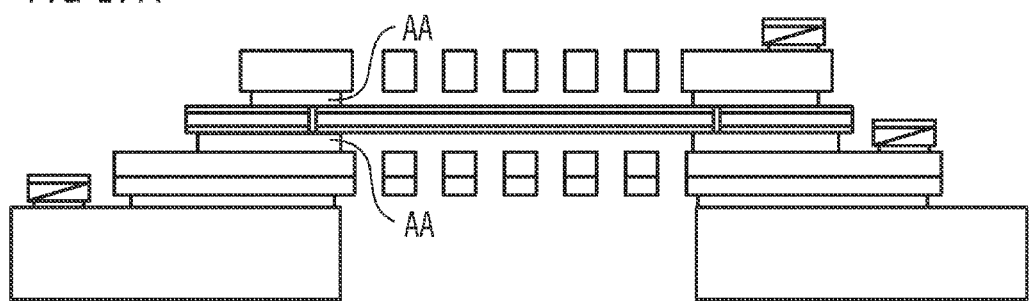
Figure 17B:
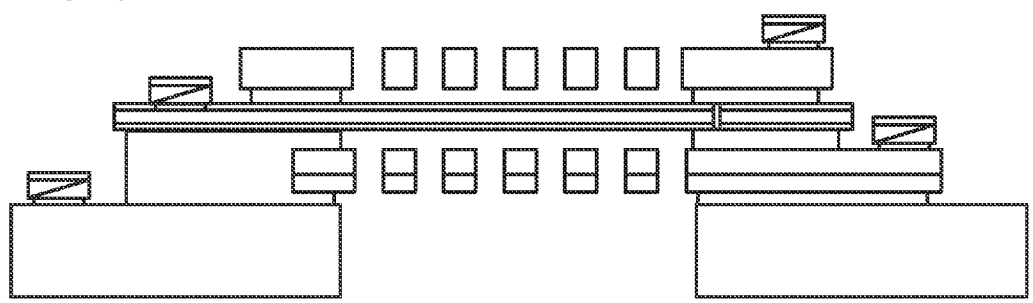

FIGS. 17A and 17B show corresponding cross sections in a different illustration. In FIG. 17A it is evident that the edge region of the membrane this cross section is fixed on both sides in an anchor region AA.

Figure 1:
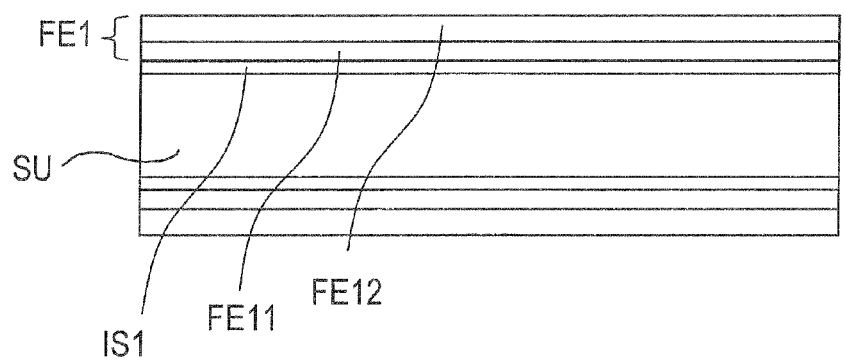
Figure 2:
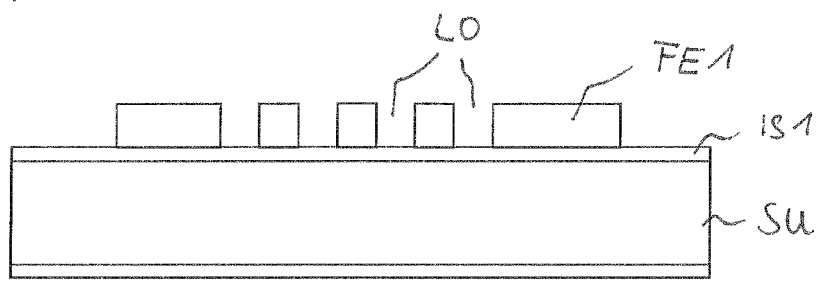
Figure 3:
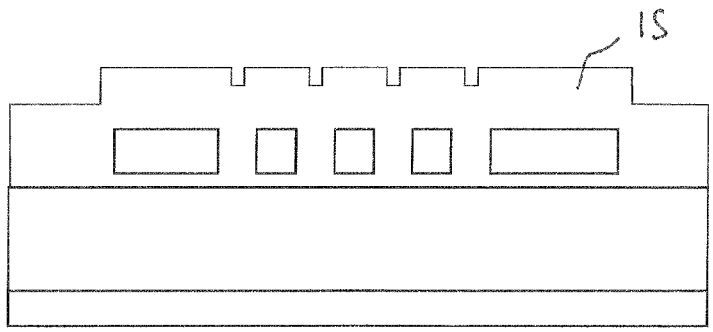
Figure 4:
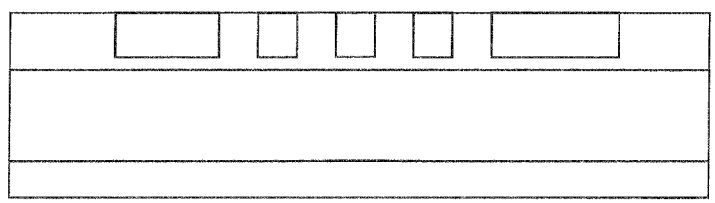
Figure 5:
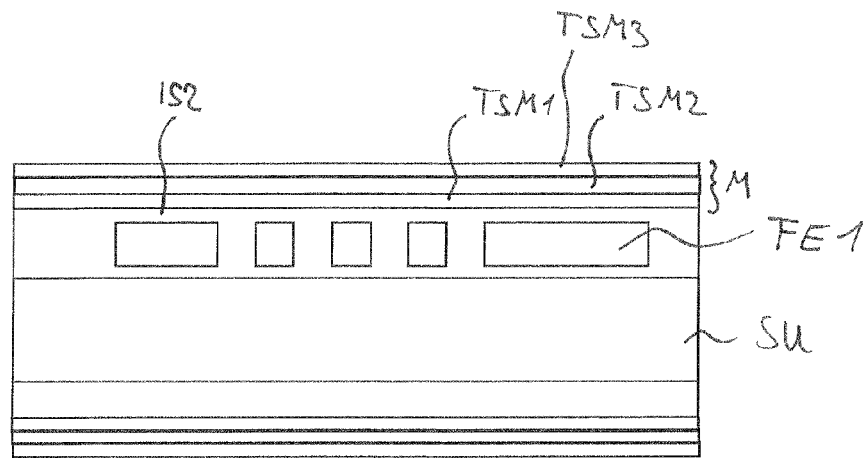
Figure 6A:
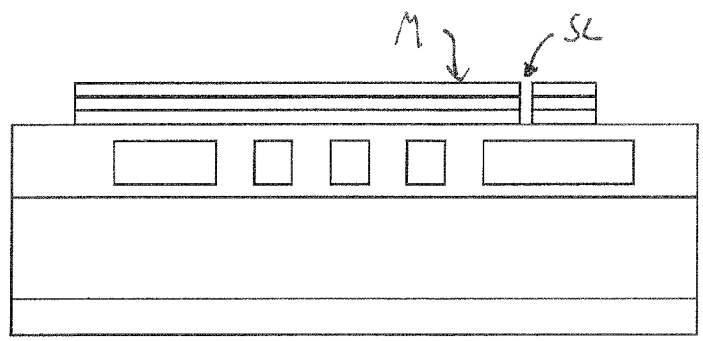
FIG. 6A shows a cross section through the connection region of the membrane, in which the partial layers of the membrane are led out from the freely oscillating region in order to provide a lead for a later a contact.
Figure 6B:
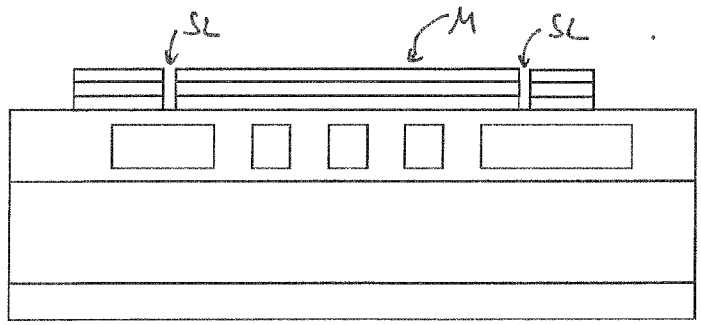
FIG. 6B shows a cross section in which the membrane is bounded by the incisions SL or is defined as the area between the incisions. A part of the layer regions outside the area bounded by the incisions SL remains for the layer composite assembly in the outer region, which mechanically stabilizes and supports the overall construction of the microphone.

The manufacture of a microphone in accordance with a second exemplary embodiment is illustrated in FIG. 13 on the basis of a plurality of specific method stages in schematic cross sections. Up to the application of the second insulation layer IS2, the procedure as in the first exemplary embodiment is adopted for this purpose, corresponding to a method state between the method stages illustrated in FIGS. 4 and 5. In this variant, first depressions V1 are then manufactured in the second insulation layer IS2. Said depressions are defined by means of a lithography and produced by means of an RIE etching method. The etching method is set such that the depressions V1 have a conical cross section and the topmost partial layer of the bottom fixed electrode is reached at the bottom of the depressions. The depressions have any desired, but preferably a round, diameter and are arranged at a distance alongside one another along a line parallel to the outer edge region. The region with the depressions corresponds to the later anchor region for the membrane. FIG. 13A shows the opened depressions V1.

In the next step, a separating layer TR1 is produced and, for this purpose, an $SiO_2$ layer having a thickness of approximately 50 nm is deposited in a TEOS LPCVD method. The separating layer TR1 serves to provide an $SiO_2$ layer having a defined layer thickness above the bottom fixed electrode. FIG. 13B shows the arrangement at this method stage.

In the next step, three partial layers for the membrane M are produced over the whole area and patterned. Deposition methods, materials, layer thicknesses and patterning are implemented as in the first exemplary embodiment. FIG. 13C shows the arrangement at this method stage. As a result of the edge-covering and therefore surface-conformal deposition of the partial layers of the membrane, the latter follow the topography of the second insulation layer IS2, such that bulges SK1 of the membrane form in the region of the depressions. Said bulges of the membrane and the bottom fixed electrode are only separated by the separation layer TS; in the remaining regions of the membrane, the full layer thickness of the second insulation layer IS2 lies between membrane and bottom fixed electrode.

Figure 13D:
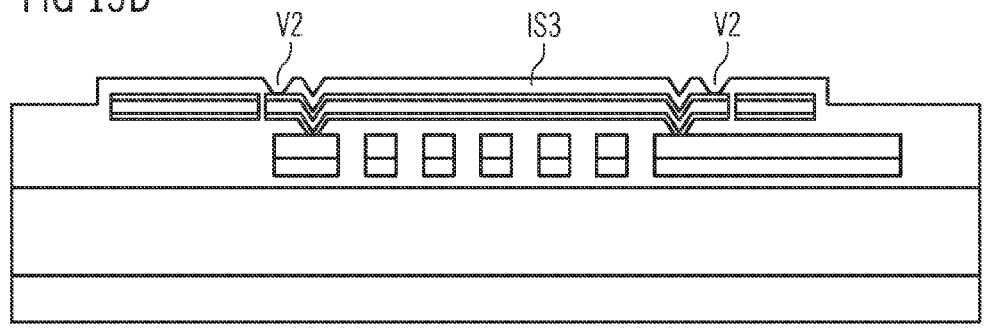
Figure 13E:
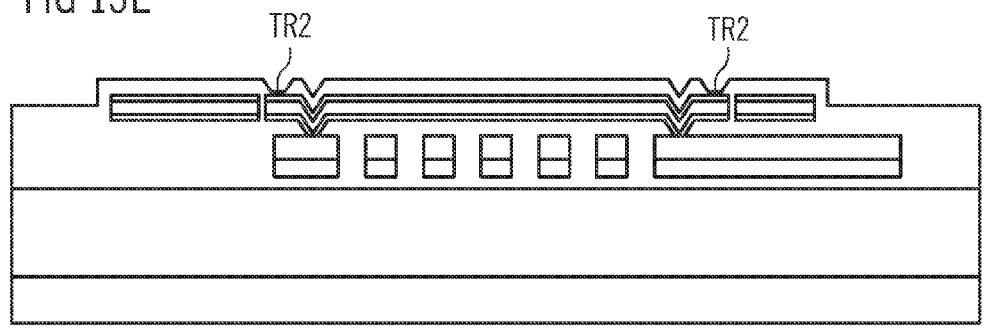

In the next step, the third insulation layer IS3 is applied over the whole area as a 2 µm thick $SiO_2$ layer, as in the first exemplary embodiment. Second depressions V2 are produced by means of a lithography and an RIE etching method. Said second depressions are likewise produced as round openings having a conical cross section and in an area region arranged adjacent to the first bulges SK1 but between said bulges and the outer structure edge of the membrane M. As a result of the conformal deposition of the third insulation layer, the latter follows the topography of the membrane and forms further depressions above the first bulges, as illustrated in FIG. 13D. For covering the membrane surface uncovered in the second depressions, a second separating layer TR2 is then produced, here a 50 nm thick $SiO_2$ layer produced by TEOS LPCVD. FIG. 13E shows the arrangement at this method stage.

Figure 13F:
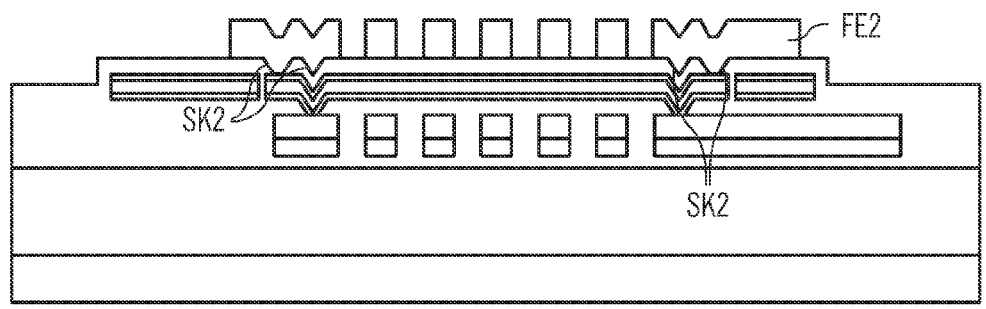

In the next step, in a manner corresponding to the first exemplary embodiment, the top fixed electrode FE2 is deposited as a 3 µm thick polysilicon layer and patterned. FIG. 13F shows the arrangement at this method stage. Since the polysilicon layer of the second fixed electrode FE2 follows the topography of the third insulation layer IS3 or the separating layer TR2 applied thereabove, it forms second bulges SK2 in the region of the second depressions V2 and in the depressions which are arranged alongside the latter and correspond to the first bulges.

Figure 14A:
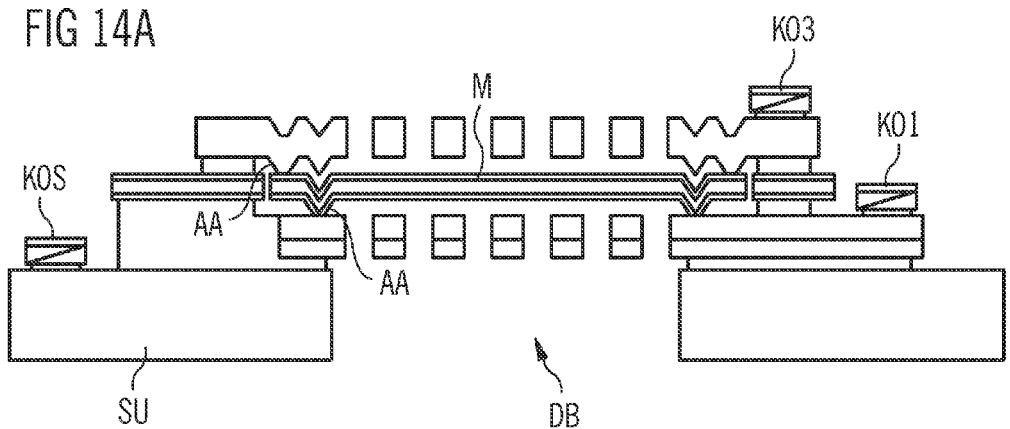

The production of the contacts, the etching-free of the perforation DB and the removal of the sacrificial layers are effected as in the first exemplary embodiment. A microphone completed in this way in accordance with the second exemplary embodiment is illustrated in cross section in FIGS. 14A and 14B. It is readily discernible from the figure that the membrane is vertically fixed in the anchor region by virtue of the first bulges SK1 of the membrane M bearing on the bottom fixed electrode FE1 and the membrane being fixed from above by the second bulges SK2 of the top fixed electrode FE2 with only little vertical leeway. In this exemplary embodiment, the insulation layers IS serving as sacrificial layers are etched back to an extent such that the membrane is also completely uncovered in the edge region. Accordingly, the membrane M, as evident in FIG. 14A, is freely movable laterally, that is to say in the layer plane.

Figure 14B:
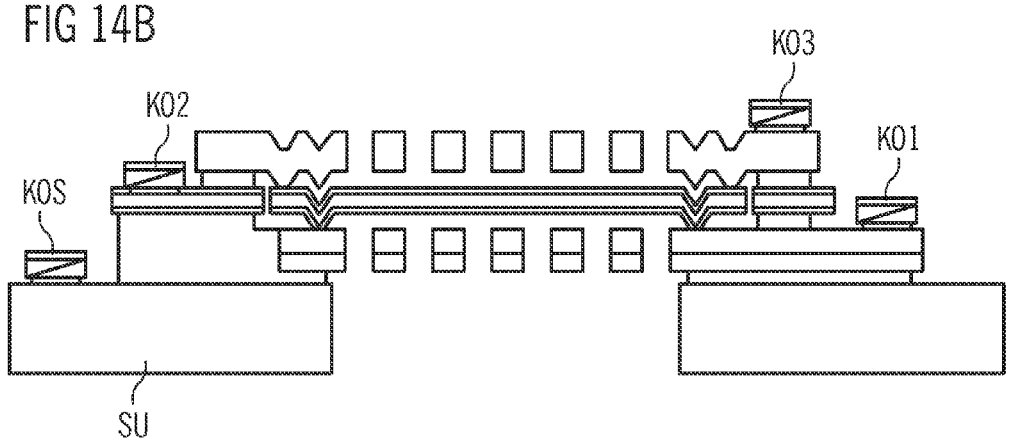

FIG. 14B shows a section through the second contact KO2 and the associated connection region of the membrane M, in which the membrane layers are led outward. Preferably, the membrane is fixed only in the connection region in the original layer composite assembly, that is to say between second and third insulation layers. The area regions of first and second bulges, corresponding to the sum of the cross sections, are minimized in order not to influence the capacitances between membrane and the two fixed electrodes to an excessively great extent, such that these are still substantially determined by the distance between the fixed electrodes and the membrane. FIG. 14 additionally illustrates a substrate contact KOS, which can be manufactured together with the rest of the contacts. In this way, it is possible to make contact with components integrated in the substrate SU. It is also possible to provide only a wiring structure on the substrate surface and to connect it to the contact KOS, via which wiring structure the microphone can be interconnected.

FIGS. 15A and 15B shows two schematic cross sections through a further embodiment variant of the microphone. This variant is a combination of the first and second exemplary embodiments. Firstly, it is distinguished by the fact that the membrane is fixed in the edge region in the original layer composite assembly, which here forms the anchor region AA. Furthermore, in this embodiment, first bulges are provided in the membrane partial layers, which, however, are arranged outside the freely oscillating region defined by the incisions SL. For this purpose, the bottom fixed electrode is uncovered in the second insulation layer IS2 (between membrane and bottom fixed electrode) in a strip-shaped region outside the incisions. Without a separating layer, the membrane is subsequently produced, such that it makes direct contact with the bottom fixed electrode in the strip-shaped patterned zone.

In the third insulation layer, second depressions V2 are likewise produced, which are arranged adjacent to the above-mentioned strip-shaped region, but likewise outside the freely oscillating region of the membrane and thus outside the structure edges of the membrane that are defined by the incisions SL. The second depressions in the third insulation layer can also form a structure line which, in the projection onto the layer plane, is led in a ring-shaped manner around the membrane and only omits the connection region of the membrane. As is shown in FIG. 15A, these patternings have the effect that outside the active region the bottom fixed electrode and the membrane in the region of the first bulges, and also the top fixed electrode FE2 in the region of the second bulges are in direct contact with one another. This direct contact guarantees that even excessively great undercutting under top fixed electrode and membrane can lead to one of the functional layers being completely etched free. Even if said insulation layers are completely removed, the three functional layers are still fixed relative to one another by the direct contact with one another. FIG. 15B again shows the section through the connection region and the associated contact KO2 of the membrane. In the connection region, the membrane is lengthened in a narrow region out of the active region and led to the contact KO2.

Figure 16A:
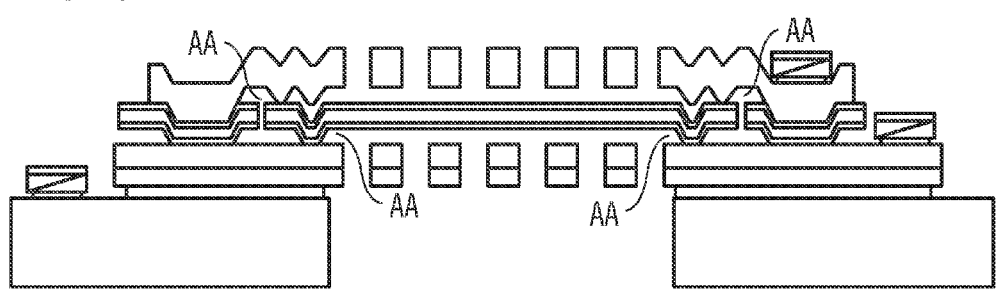

FIG. 16A shows a further variant for the patterning of a microphone, in which the structure edges of the membrane are completely etched free in the outer edge region. In the anchor region AA, the membrane is vertically fixed against the bottom fixed electrode by first bulges, while second bulges of the top fixed electrode press onto the edge region of the membrane from above and fix said edge region from above. In an outer region outside the active region, second and third insulation layers are removed prior to the application of membrane and top fixed electrode, respectively, in a strip-shaped region, such that there the membrane is produced directly on the bottom fixed electrode and the top fixed electrode is produced directly on the membrane and they can form a fixed layer composite assembly with one another there.

Figure 16B:
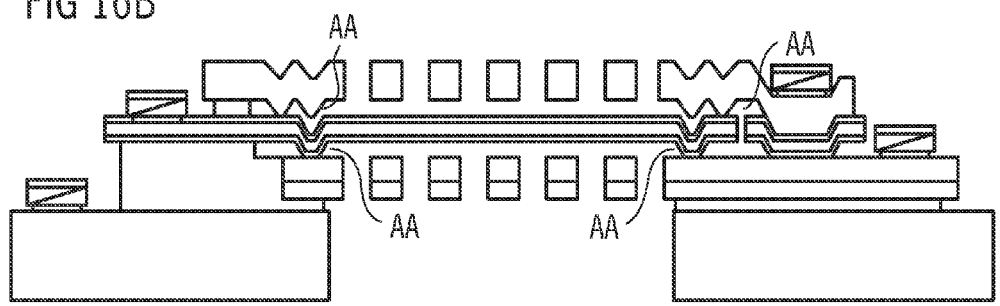

FIG. 16B shows in section through the connection region and the contact of the membrane that only the connection region has a different layer composite assembly. Only in the connection region is the membrane completely surrounded by insulation layers and thus better insulated from the two fixed electrodes.

Figure 18:
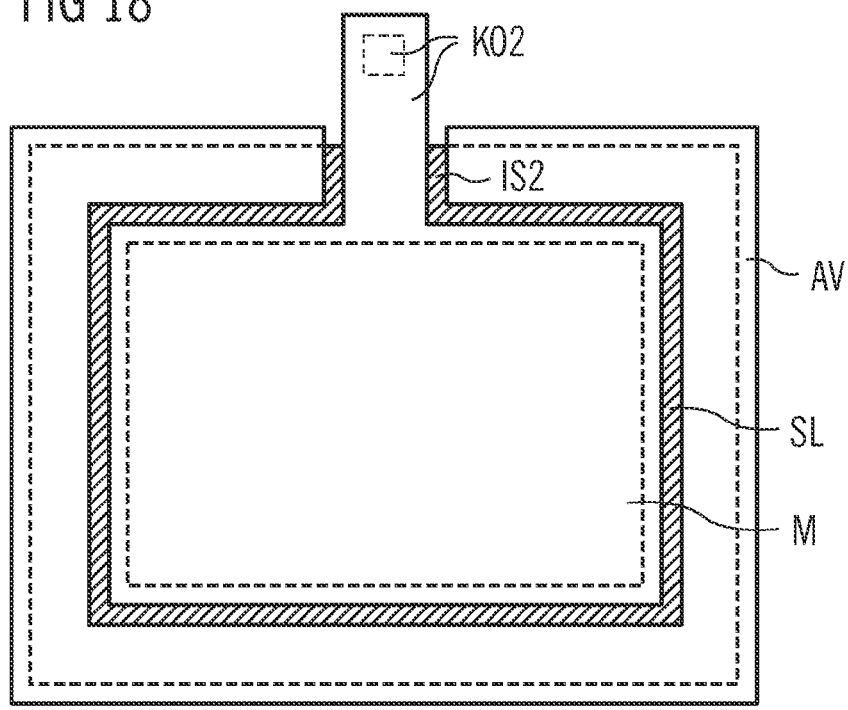

FIG. 18 shows a possible patterning of the membrane M in schematic plan view. The membrane is applied above the second insulation layer IS2, which is illustrated in hatched fashion and the concealed structure edges of which are illustrated in dashed fashion. The edge region of the membrane therefore bears on the second insulation layer and can form an anchor region. The incision SL separates outer regions AU of the membrane partial layers from the (electrically) active membrane. The connection region is led to a contact KO. The third insulation layer IS (not illustrated) can be patterned similarly to the second insulation layer IS, such that the anchor regions thereof areally correspond and fix the membrane there from above and below.

Figure 19:
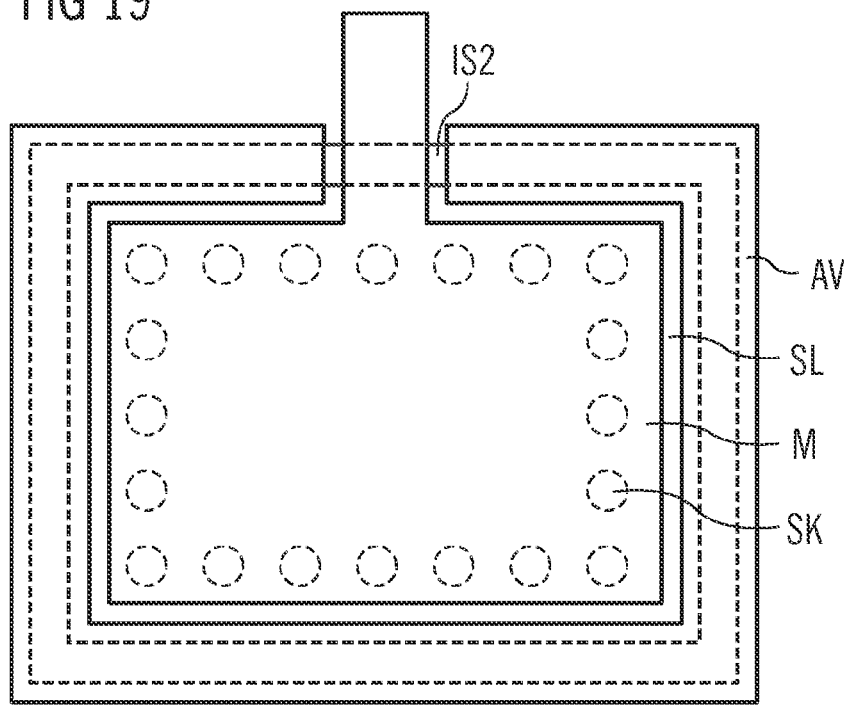

FIG. 19 shows a membrane M, the edge region of which is free from underlying second insulation layer IS2. The anchor region is formed by the first bulges SK1 of the membrane and the second bulges (not illustrated) of the top fixed electrode. The second insulation layer IS2 lies below the outer region AU of the membrane partial layers, that is to say outside the region delimited by the incision SL.

LIST OF REFERENCE SIGNS

AA Anchor region of the membrane
AU Outer region (beyond the incision)
DB Perforation (in the substrate)
FE1 Bottom fixed electrode
FE2 Top fixed electrode
FS Functional layer
IS1-IS4 First to fourth insulation layer
KL Contact holes
KO Contacts
LO Holes
M Membrane
SK1 First bulge (in the membrane)
SK2 Second bulge (in the top fixed electrode)
SL Incision
SU Substrate
TA Connection region of the membrane
TS Partial layers of the layer construction
V1, V2 Depressions in 2nd and 3rd insulation layer
TR Separating layer
KOS Substrate contact

The invention claimed is:

1. A microphone of miniaturized MEMS design having a substrate comprising silicon and a patterned layer construction arranged thereon,
wherein the layer construction comprises partial layers arranged one above another for the following functional layers:
a bottom fixed electrode, thereabove
a membrane and thereabove
a top fixed electrode,
wherein the membrane is areally divided into
an outer edge region,
a freely oscillating region, which is completely enclosed by the outer edge region and in which the membrane is embodied in substantially planar fashion,
an anchor region within the outer edge region, in which the membrane is vertically fixed between bottom and top fixed electrodes, wherein the outer edge region substantially consists of the anchor region,
a connection region within the outer edge region, in which an electrical lead to the membrane is arranged,
wherein a perforation is arranged through the substrate below the entire freely oscillating region, and wherein the anchor region is arranged outside the area region of the perforation above an inner edge region of the substrate,
wherein the partial layers forming the membrane are electrically isolated from the remaining area regions of the corresponding partial layers by an incision running outside the outer edge region and omitting the connection region, and
wherein, at least outside the region enclosed by the incision, insulation layers are arranged between bottom fixed electrode and membrane and between membrane and top fixed electrode.

2. The microphone according to claim 1,
wherein all partial layers of the layer construction are produced directly one above another as a layer composite assembly, and wherein the membrane is fixed in the anchor region in the original layer composite assembly.

3. The microphone according to claim 1,
wherein the membrane has in the anchor region a first bulge, by which it is supported on the bottom fixed electrode.

4. The microphone according to claim 3,
wherein the top fixed electrode has in the anchor region a second bulge, by which it is supported on the membrane.

5. The microphone according to claim 4,
wherein first and second bulges bear on the respectively adjacent partial layer of the layer construction, such that the membrane is freely moveable in the anchor region within the layer plane, but fixed against a vertical deflection.

* * * * *